US006792051B1

(12) United States Patent
Mohan et al.

(10) Patent No.: US 6,792,051 B1
(45) Date of Patent: Sep. 14, 2004

(54) IN-BAND-ON-CHANNEL BROADCAST SYSTEM FOR DIGITAL DATA

(75) Inventors: Chandra Mohan, Carmel, IN (US); Zhiming Zhang, Indianapolis, IN (US); Manuel Apraez, Carmel, IN (US)

(73) Assignee: Thomson Licensing S.A., Boulogne-Billancourt (FR)

( * ) Notice: Subject to any disclaimer, the term of this patent is extended or adjusted under 35 U.S.C. 154(b) by 559 days.

(21) Appl. No.: 09/626,295

(22) Filed: Jul. 25, 2000

(51) Int. Cl.[7] .................................................. H03D 1/00

(52) U.S. Cl. ........................ 375/324; 375/340; 370/487; 370/529; 455/143; 455/203; 455/214

(58) Field of Search ................................. 375/239, 240, 375/322, 324, 340; 370/487, 529; 455/143, 203, 214

(56) References Cited

U.S. PATENT DOCUMENTS

| | | | | |
|---|---|---|---|---|
| 4,408,166 A | * 10/1983 | Moeller | ...................... | 329/312 |
| 6,359,525 B1 | * 3/2002 | Mohan et al. | .............. | 332/108 |
| 6,590,944 B1 | * 7/2003 | Kroeger | ...................... | 375/340 |

FOREIGN PATENT DOCUMENTS

| | | | |
|---|---|---|---|
| WO | WO97/39544 | 10/1997 | ............ H04H/5/00 |
| WO | WO99/20007 | 4/1999 | ............ H04N/1/00 |
| WO | WO99/46861 | 9/1999 | ............ H03M/5/08 |

* cited by examiner

*Primary Examiner*—Amanda T. Le
(74) *Attorney, Agent, or Firm*—Joseph S. Tripoli; Joseph L. Laks; Ronald H. Kurdyla

(57) ABSTRACT

An FM broadcast transmitter transmits a broadcast signal having a carrier at a broadcast frequency and sidebands, able to be transmitted at full power, within a transmission bandwidth around the carrier. It includes a source of a modulated FM stereo signal having a carrier at the broadcast frequency and having sidebands with a bandwidth less than the transmission bandwidth representing a stereo signal. It also includes a source of a modulated IBOC signal, having carrier pulses spaced relative to each other to represent the IBOC digital data signal encoded as a variable pulse width encoded signal, and a bandwidth within the transmission bandwidth not overlapping the FM stereo signal sidebands. A signal combiner combines the modulated FM stereo signal and the modulated IBOC signal to form the broadcast signal.

An FM broadcast receiver receives a broadcast signal including a first modulated signal representing an FM stereo signal, and a second modulated signal, having carrier pulses spaced relative to each other to represent an in-band-on-channel (IBOC) digital data signal encoded as a variable pulse width encoded signal. It includes a signal separator for generating a first separated signal representing the FM stereo signal and a second separated signal representing the IBOC digital data signal. An FM signal processor generates a stereo audio signal represented by the FM stereo signal. An IBOC signal processor generates a digital data signal represented by the IBOC digital data signal.

13 Claims, 5 Drawing Sheets

IN-BAND-ON-CHANNEL BROADCAST SYSTEM FOR DIGITAL DATA

FIELD OF THE INVENTION

The present invention relates to a modulation technique which provides a high data rate through band limited channels, and in particular to an in-band-on-channel (IBOC) FM broadcast modulation system for digital data, especially digital audio.

BACKGROUND OF THE INVENTION

In the United States, FM broadcasters can transmit information in sidebands within 100 kHz of their assigned carrier frequency at full power, and from 100 kHz to 200 kHz around the carrier at 30 dB down from full power. The standard stereo audio signal is placed in a bandwidth within 53 kHz of the carrier. The broadcaster is, thus, able to transmit other information in the remainder of the bandwidth, subject to the constraints described above.

It has become desirable for FM broadcasters to simultaneously broadcast stereo audio and digital data. The digital data could, for example, represent a high quality version of the stereo audio being broadcast. This requires a relatively high data rate channel which is restricted to a relatively narrow bandwidth. For example, a digital data stream carrying high quality audio can have a bit rate of 128 kilobits per second (kbps). A signal carrying such a data stream cannot be transmitted in the bandwidth available in an FM broadcast signal without some form of compression to decrease the bandwidth required for the signal.

It is always desirable to provide data at higher data rates through channels which have limited bandwidth. Many modulation techniques have been developed for increasing the data rate through a channel. For example, M-ary phase shift keyed (PSK) and Quadrature Amplitude Modulation (QAM) techniques permit compression by encoding a plurality of data bits in each transmitted symbol. Such systems have constraints associated with them. First, the hardware associated with such systems is expensive. This is because these techniques require a high level of channel linearity in order to operate properly. Consequently, extensive signal processing must be performed for carrier tracking, symbol recovery, interpolation and signal shaping. Second, such techniques are sensitive to multipath effects. These effects need to be compensated for in the receiver. Third, these systems often require bandwidths beyond those available in some applications (for example in-band on-channel broadcast FM subcarrier service) for the desired data rates.

SUMMARY OF THE INVENTION

In accordance with principles of the present invention, an FM broadcast transmitter transmits a broadcast signal having a carrier at a broadcast frequency and sidebands, able to be transmitted at full power, within a transmission bandwidth around the carrier. It includes a source of a modulated FM stereo signal having a carrier at the broadcast frequency and having sidebands with a bandwidth less than the transmission bandwidth representing a stereo signal. It also includes a source of a modulated IBOC signal, having carrier pulses spaced relative to each other to represent the IBOC digital data signal encoded as a variable pulse width encoded signal, and a bandwidth within the transmission bandwidth not overlapping the FM stereo signal sidebands. A signal combiner combines the modulated FM stereo signal and the modulated IBOC signal to form the broadcast signal.

In accordance with another aspect of the present invention, an FM broadcast receiver receives a broadcast signal including a first modulated signal representing an FM stereo signal, and a second modulated signal, having carrier pulses spaced relative to each other to represent an in-band-on-channel (IBOC) digital data signal encoded as a variable pulse width encoded signal. It includes a signal separator for generating a first separated signal representing the FM stereo signal and a second separated signal representing the IBOC digital data signal. An FM signal processor generates a stereo audio signal represented by the FM stereo signal. An IBOC signal processor generates a digital data signal represented by the IBOC digital data signal.

The technique according to the principles of the present invention provides an FM transmission system which includes a second channel carrying a relatively high data rate digital signal. This channel is placed in the portion of the FM bandwidth which can be transmitted at full power. The circuitry required to implement such a channel is relatively simple and inexpensive. Further, it does not require high channel linearity and is not subject to multipath problems. The additional circuitry necessary to implement this channel in a receiver is relatively small, and may be coupled to the output of the preexisting IF circuit in the receiver.

DETAILED DESCRIPTION

Figure 1:
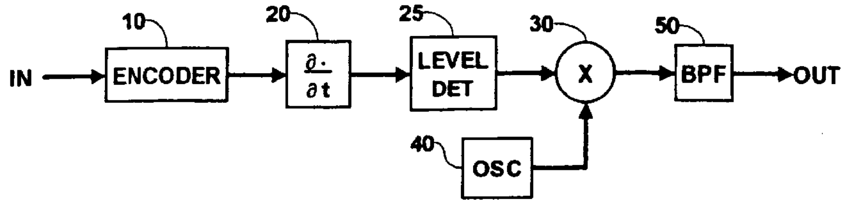
FIG. 1 is a block diagram of a modulator which may be used in an FM broadcast system according to the present invention.

FIG. 1 is a block diagram of a modulator which may be used in the present invention. In FIG. 1, an input terminal IN receives a digital signal. The input terminal IN is coupled to an input terminal of an encoder 10. An output terminal of the encoder 10 is coupled to an input terminal of a differentiator 20. An output terminal of the differentiator 20 is coupled to an input terminal of a level detector 25. An output terminal of the level detector 25 is coupled to a first input terminal of a mixer 30. A local oscillator 40 is coupled to a second input terminal of the mixer 30. An output terminal of the mixer 30 is coupled to an input terminal of a bandpass filter (BPF) 50. An output terminal of the BPF 50 is coupled to an output terminal OUT, which generates a modulated signal representing the digital signal at the input terminal IN.

Figure 2:
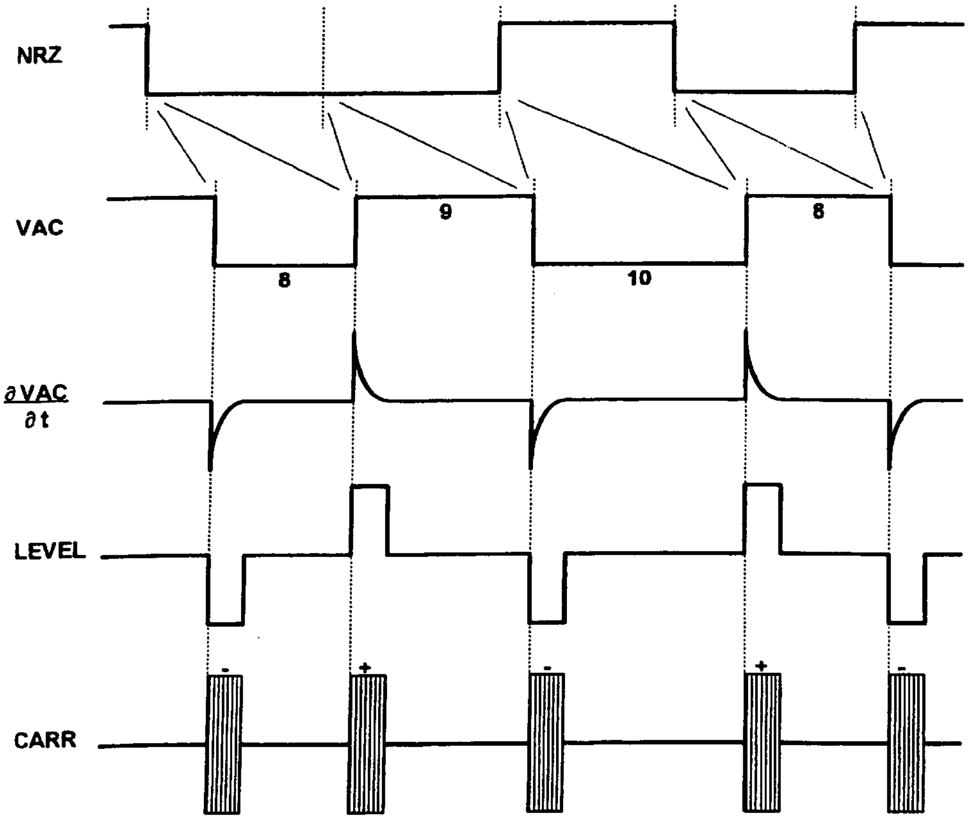
FIG. 2 is a waveform diagram useful in understanding the operation of the modulator illustrated in FIG. 1.

FIG. 2 is a waveform diagram useful in understanding the operation of the modulator illustrated in FIG. 1. FIG. 2 is not drawn to scale in order to more clearly illustrate the waveforms. In the illustrated embodiment, the digital signal at the input terminal IN is a bilevel signal in non-return-to-zero (NRZ) format. This signal is illustrated as the top waveform in FIG. 2. The NRZ signal carries successive bits, each lasting for a predetermined period called the bit period, shown by dashed lines in the NRZ signal, and having a corresponding frequency called the bit rate. The level of the NRZ signal represents the value of that bit, all in a known manner. The encoder 10 operates to encode the NRZ signal using a variable pulse width code. In the illustrated embodiment, the variable pulse width code is a variable aperture code. Variable aperture coding is described in detail in U.S. Patent Application Ser. No. 09/623,776 filed Dec. 06, 2000 by (inventor(s)). In this patent application, an NRZ signal is phase encoded in the following manner.

Each bit period in the NRZ signal is coded as a transition in the encoded signal. An encoding clock at a multiple M of the bit rate is used to phase encode the NRZ signal. In the above mentioned patent application, the encoding clock runs at a rate M which is nine times the bit rate. When the NRZ signal transitions from a logic ‘1’ level to a logic ‘0’ level, a transition is made in the encoded signal eight encoding clock cycles (M−1) from the previous transition. When the NRZ signal transitions from a logic ‘0’ level to a logic ‘1’ level, a transition is made in the encoded signal 10 encoding clock cycles (M+1) from the previous transition. When the NRZ signal does not transition, that is if successive bits have the same value, then a transition is made in the encoded signal nine encoding clock cycles (M) from the last transition. The variable aperture coded signal (VAC) is illustrated as the second waveform in FIG. 2.

The variable aperture coded signal (VAC) is differentiated by the differentiator 20 to produce a series of pulses time aligned with transitions in the VAC signal. The differentiator also gives a 90 degree phase shift to the VAC modulating signal. Leading edge transitions produce positive-going pulses and trailing edge transitions produce negative-going pulses, all in a known manner. The differentiated VAC signal $$\frac{\partial VAC}{\partial t}$$

is illustrated as the third signal in FIG. 2. The $$\frac{\partial VAC}{\partial t}$$

signal is level detected by the level detector 25 to generate a series of trilevel pulses having constant amplitudes. When the differentiated VAC signal $$\frac{\partial VAC}{\partial t}$$

has a value greater than a positive threshold value, a level signal is generated having a high value; when it has a value less than a negative threshold value, a level signal is generated having a low value, otherwise a level signal is generated having a center value, all in a known manner. The level signal is shown as the fourth signal (LEVEL) in FIG. 2.

The LEVEL signal modulates a carrier signal from the local oscillator 40 in the mixer 30. A positive pulse produces a pulse of carrier signal having a first phase, and a negative pulse produces a pulse of carrier signal having a second phase. The first and second phases are preferably substantially 180 degrees out of phase. This carrier signal pulse is preferably substantially one coding clock period long, and in the illustrated embodiment, has a duration of substantially 1/9 of the NRZ bit period. The frequency of the local oscillator 40 signal is selected so that preferably at least 10 cycles of the local oscillator signal can occur during the carrier signal pulse time period. In FIG. 2, the carrier signal CARR is illustrated as the bottom waveform in which the carrier signal is represented by vertical hatching within respective rectangular envelopes. In the CARR signal illustrated in FIG. 2, the phase of carrier pulses generated in response to positive-going LEVEL pulses are represented by a “+”, and the phase of carrier pulses generated in response to negative-going LEVEL pulses are represented by a “−”. The “+” and “−” represent only substantially 180 degree phase differences and are not intended to represent any absolute phase.

The BPF 50 filters out all “out-of-band” Fourier components in the CARR signal, as well as the carrier component itself and one of the sidebands, leaving only a single sideband signal. The output signal OUT from the BPF 50, thus, is a single sideband (SSB) phase or frequency modulated signal representing the NRZ data signal at the input terminal IN. This signal may be transmitted to a receiver by any of the many known transmission techniques.

Figure 3:
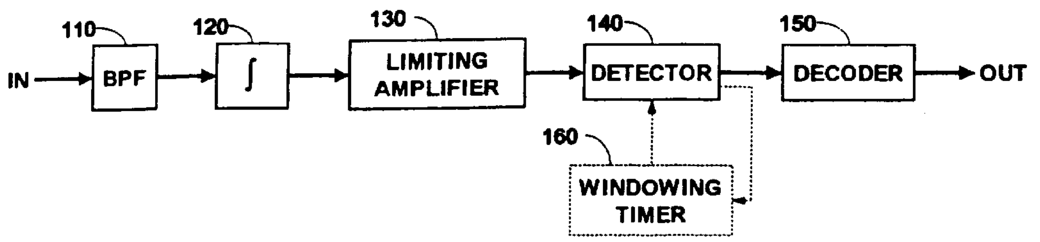
FIG. 3 is a block diagram of a receiver which can receive a signal modulated according to the modulator illustrated in FIG. 1.

FIG. 3 is a block diagram of a receiver which can receive a signal modulated as illustrated in FIG. 1. In FIG. 3, an input terminal IN is coupled to a source of a signal modulated as described above with reference to FIGS. 1 and 2. The input terminal IN is coupled to an input terminal of a BPF 110. An output terminal of the BPF 110 is coupled to an input terminal of an integrator 120. An output terminal of the integrator 120 is coupled to an input terminal of a limiting amplifier 130. An output terminal of the limiting amplifier 130 is coupled to an input terminal of a detector 140. An output terminal of the detector 140 is coupled to an input terminal of a decoder 150. An output terminal of the decoder 150 reproduces the NRZ signal represented by the modulated signal at the input terminal IN and is coupled to an output terminal OUT.

In operation, the BPF 110 filters out out-of-band signals, passing only the modulated SSB signal. The integrator 120 reverses the 90 degree phase shift which is introduced by the differentiator 20 (of FIG. 1). The limiting amplifier 130 restricts the amplitude of the signal from the integrator 120 to a constant amplitude. The signal from the limiting amplifier 130 corresponds to the carrier pulse signal CARR illustrated in FIG. 2. The detector 140 is either an FM discriminator, or a phase-locked loop (PLL) used to demodulate the FM or PM modulated, respectively, carrier pulse signals. The detector 140 detects the carrier pulses and generates a bilevel signal having transitions represented by the phase and timings of those pulses. The output of the detector 140 is the variable bit width signal corresponding to the VAC signal in FIG. 2. The decoder 150 performs the inverse operation of the encoder 10 (of FIG. 1), and generates the NRZ signal, corresponding to the NRZ signal in FIG. 2, at the output terminal OUT. The above mentioned U.S. Patent application (RCA 88,945) describes a decoder 150 which may be used in FIG. 3. The NRZ signal at the output terminal OUT is then processed by utilization circuitry (not shown).

Because the carrier pulses (signal CARR in FIG. 2) occur at well defined times with respect to each other, and because those pulses are limited in duration, it is possible to enable the detector 140 only at times when pulses are expected. For example, in the illustrated embodiment, as described in detail above, each pulse has a duration substantially 1/9 of the time between NRZ signal transition times. After a carrier pulse is received 8/9 of the time between NRZ signal transitions since the preceding carrier pulse (representing a trailing edge), succeeding pulses are expected only at 9/9 (no transition) or 10/9 (leading edge) of the time between NRZ signal transitions from that pulse. Similarly, after a carrier pulse is received 10/9 of the time between NRZ signal transitions since the preceding carrier pulse (representing a leading edge), succeeding pulses are expected only at 8/9 (trailing edge) or 9/9 (no transition) of the time between NRZ signal transitions from that pulse. The detector 140 only need be enabled when a carrier pulse is expected, and only in the temporal neighborhood of the duration of the expected pulse.

A windowing timer, illustrated as 160 in phantom in FIG. 3, has an input terminal coupled to a status output terminal of the detector 140 and an output terminal coupled to an enable input terminal of the detector 140. The windowing timer 160 monitors signals from the detector 140 and enables the detector only when a carrier pulse is expected and only in the temporal neighborhood of the duration of that pulse, as described above.

In the illustrated embodiment, the energy in the modulated signal lies primarily between 0.44 (8/18) and 0.55 (10/18) times the bit rate, and consequently has a bandwidth of 0.11 times the bit rate. This results in increasing the data rate through the bandwidth by nine times. Other compression ratios are easily achieved by changing the ratio of the encoding clock to the bit rate, with trade-offs and constraints one skilled in the art would readily appreciate.

The system described above may be implemented with less sophisticated circuitry than either M-ary PSK or QAM modulation techniques in both the transmitter and receiver. More specifically, in the receiver, after the modulated signal is extracted, limiting amplifiers (e.g. 130) may be used, which is both less expensive and saves power when compared to other circuits0. Also both the encoding and decoding of the NRZ signal may be performed with nominally fast programmable logic devices (PLDs). Such devices are relatively inexpensive (currently $1 to $2). In addition, there is no intersymbol interference in this system, so waveform shaping is not required. Further, there are no tracking loops required, except for the clock recovery loop.

Because, as described above, carrier transmission occurs only at bit boundaries and does not continue for the entire bit period, temporal windowing may be used in the receiver to detect received carrier pulses only at times when pulses are expected. Consequently, there are no multi-path problems with the present system.

Figure 4:
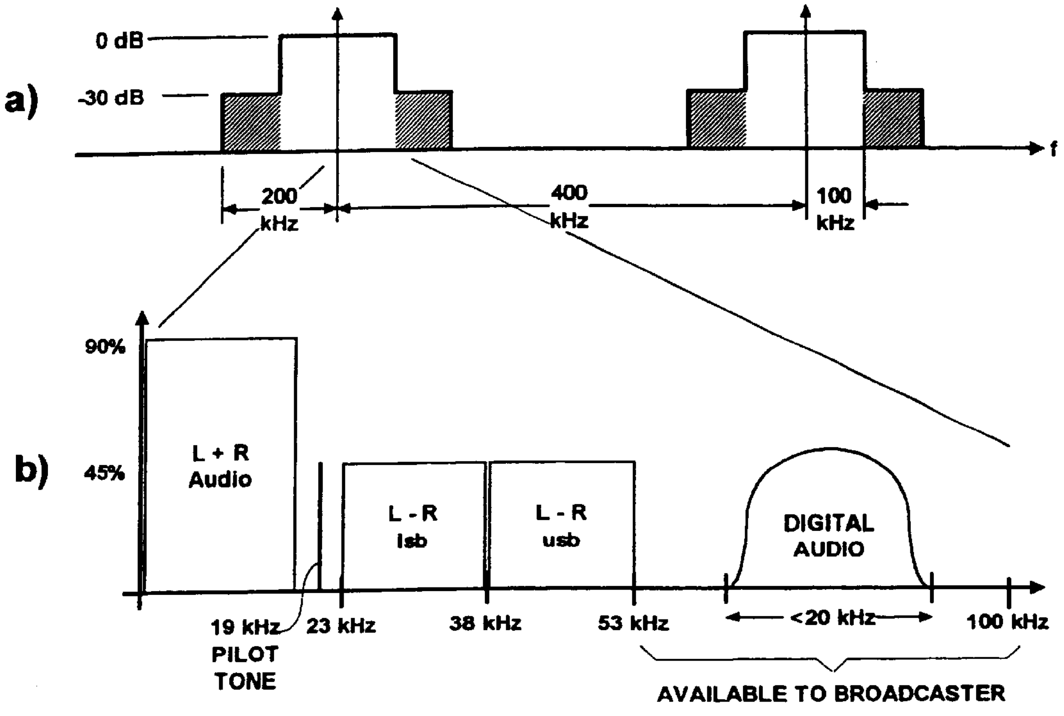
FIG. 4 is a spectrum diagram useful in understanding an application of the modulation technique illustrated in FIGS. 1 and 2 according to the present invention.

In accordance with principles of the present invention, the modulation technique described above is used to transmit digital data (e.g. CD quality digital music) simultaneously with FM monophonic and stereophonic broadcast audio signals in an FM broadcast signal. FIG. 4 is a spectrum diagram useful in understanding the application of the modulation technique illustrated in FIGS. 1 and 2 to a system according to the present invention. FIG. 4*a* illustrates the power envelope for FM broadcast signals in the United States. In FIG. 4*a*, the horizontal line represents frequency, and represents a portion of the VHF band somewhere between approximately 88 MHz and approximately 107 MHz. Signal strength is represented in the vertical direction. The permitted envelopes of spectra of two adjacent broadcast signals are illustrated. Each carrier is illustrated as a vertical arrow. Around each carrier are sidebands which carry the broadcast signal FM modulated on the carrier.

In the United States, FM radio stations may broadcast monophonic and stereophonic audio at full power in sidebands within 100 kHz of the carrier. In FIG. 4*a* these sidebands are illustrated unhatched. The broadcaster may broadcast other information in the sidebands from 100 kHz to 200 kHz, but power transmitted in this band must be 30 dB down from full power. These sidebands are illustrated hatched. Adjacent stations (in the same geographical area) must be separated by at least 400 kHz.

The upper sideband above the carrier of the lower frequency broadcast signal in FIG. 4*a* is illustrated in the lower spectrum diagram of FIG. 4*b*. In FIG. 4*b*, the vertical direction represents modulation percentage. In FIG. 4*b*, the monophonic audio signal L+R audio signal is transmitted in the 0 to 15 kHz sideband at 90% modulation level. The L−R audio signal is transmitted as a double-sideband-suppressed-carrier signal around a suppressed subcarrier frequency of 38 kHz at 45% modulation level. A lower sideband (lsb) runs from 23 kHz to 38 kHz, and an upper sideband (usb) runs from 38 kHz to 53 kHz. A 19 kHz pilot tone (one-half the frequency of the suppressed carrier) is also included in the sidebands around the main carrier. Thus, 47 kHz in both the upper sideband (FIG. 4*b*) and the lower sideband (not shown) around the main carrier (i.e. from 53 kHz to 100 kHz) remains available to the broadcaster to broadcast additional information at full power. As described above, from 100 kHz to 200 kHz transmitted power must be 30 dB down from full power.

Using the modulation technique illustrated in FIGS. 1 and 2, described above, a 128 kilobit-per-second (kbps) signal, containing an MP3 CD quality audio signal, may be compressed and transmitted in a bandwidth less than 20 kHz. This digital audio signal may be placed in the space between 53 kHz and 100 kHz in the upper sideband (for example) and transmitted as a subcarrier signal along with the regular broadcast stereo audio signal, as illustrated in FIG. 4*b*. In FIG. 4*b*, the digital audio signal is the SSB signal described above centered at around 70 kHz, and runs from approximately 60 kHz to 80 kHz. This is within 100 kHz of the main carrier and, thus, may be transmitted at full power. Such a signal is termed an in-band-on-channel (IBOC) signal.

Figure 5:
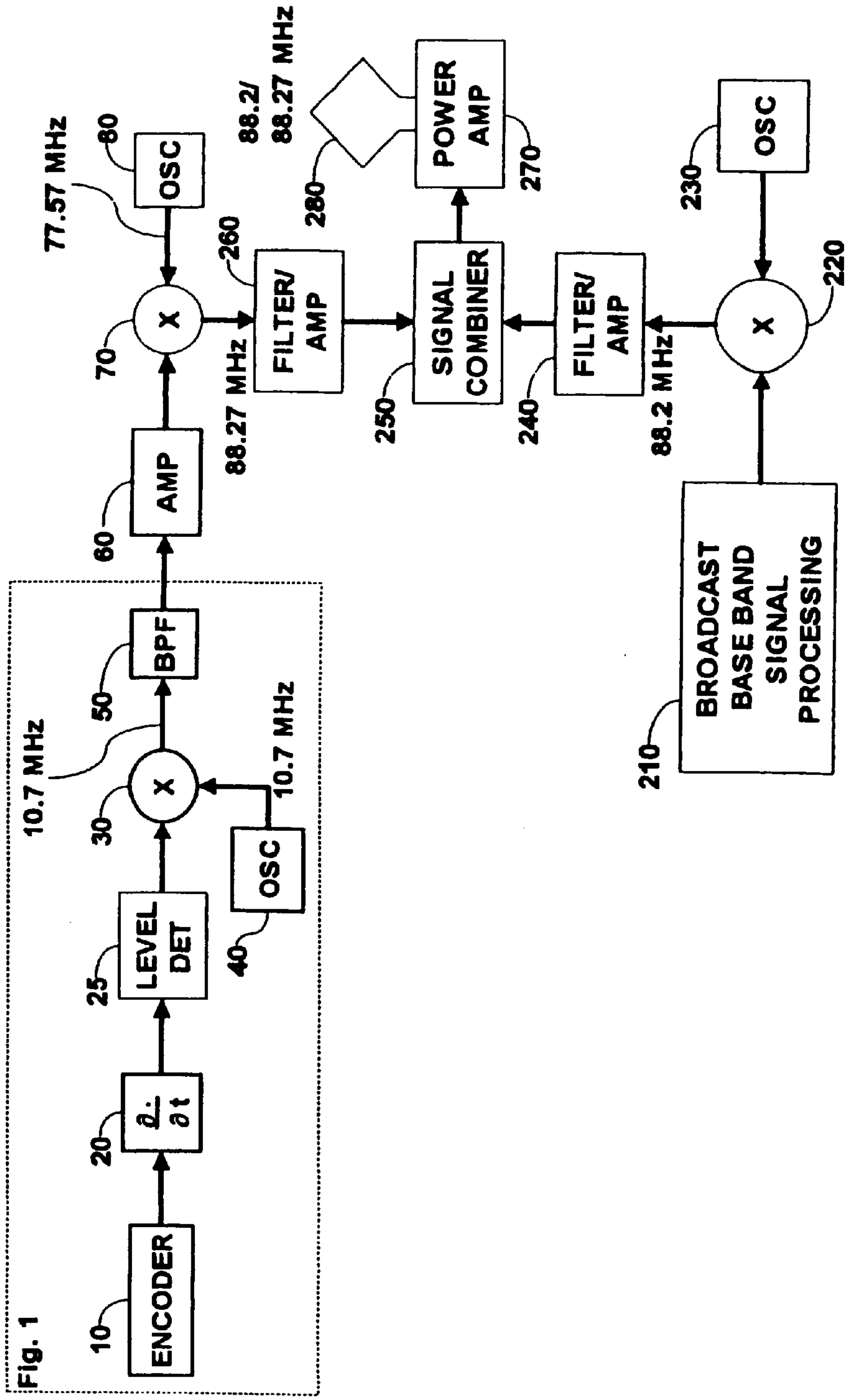
FIG. 5 is a block diagram of an FM broadcast transmitter incorporating an in-band-on-channel digital transmission channel according to the present invention.

FIG. 5 is a block diagram of an FM broadcast transmitter incorporating an in-band-on-channel digital transmission channel according to the present invention, and implemented using the modulation technique described above with reference to FIGS. 1 through 3. In FIG. 5, those elements which are the same as those illustrated in FIG. 1 are enclosed in a dashed rectangle labeled "FIG. 1", are designated with the same reference numbers and are not described in detail below. The combination of the encoder 10, differentiator 20, mixer 30, oscillator 40 and BPF 50 generates an SSB phase or frequency modulated signal (CARR of FIG. 2) representing a digital input signal (NRZ of FIG. 2), all as described above with reference to FIG. 1. An output terminal of the BPF 50 is coupled to an input terminal of an amplifier 60. An output terminal of the amplifier 60 is coupled to a first input terminal of a second mixer 70. A second oscillator 80 is coupled to a second input terminal of the second mixer 70.

An output terminal of the second mixer 70 is coupled to an input terminal of a first filter/amplifier 260. An output terminal of the first filter/amplifier 260 is coupled to a first input terminal of a signal combiner 250.

An output terminal of a broadcast baseband signal processor 210 is coupled to a first input terminal of a third mixer 220. A third oscillator 230 is coupled to a second input terminal of the third mixer 220. An output terminal of the third mixer 220 is coupled to an input terminal of a second filter/amplifier 240. An output terminal of the second filter/amplifier 240 is coupled to a second input terminal of the signal combiner 250. An output terminal of the signal combiner 250 is coupled to an input terminal of a power amplifier 270, which is coupled to a transmitting antenna 280.

In operation, the encoder 10 receives a digital signal representing the digital audio signal. In a preferred embodiment, this signal is an MP3 compliant digital audio signal. More specifically, the digital audio data stream is forward-error-correction (FEC) encoded using a Reed-Solomon (RS) code. Then the FEC encoded data stream is packetized. This packetized data is then compressed by the circuitry illustrated in FIG. 1, into an SSB signal, as described in detail above.

The frequency of the signal produced by the oscillator 40 is selected to be 10.7 MHz, so the digital information from the encoder 10 is modulated to a center frequency of 10.7 MHz. The modulation frequency may be any frequency, but is more practically selected so that it corresponds to the frequencies of existing low cost BPF filters. For example, typical BPF filters have center frequencies of 6 MHz, 10.7 MHz, 21.4 MHz, 70 MHz, 140 MHz, etc. In the illustrated embodiment, 10.7 MHz is selected for the modulating frequency, and the BPF 50 is implemented as one of the existing 10.7 MHz filters. The filtered SSB signal from the BPF 50 is amplified by amplifier 60 and up-converted by the combination of the second mixer 70 and second oscillator 80. In the illustrated embodiment, the second oscillator 80 generates a signal at 77.57 MHz and the SSB is up-converted to 88.27 MHz. This signal is filtered and further amplified by the first filter/amplifier 260.

The broadcast baseband signal processor 210 receives a stereo audio signal (not shown) and performs the signal processing necessary to form the composite stereo signal, including the L+R signal at baseband, the double-sideband-suppressed-carrier L−R signal at a (suppressed) carrier frequency of 38 kHz and a 19 kHz pilot tone, all in a known manner. This signal is then modulated onto a carrier signal at the assigned frequency of the FM station. The third oscillator 230 produces a carrier signal at the assigned broadcast frequency which, in the illustrated embodiment, is 88.2 MHz. The third mixer 220 generates a modulated signal modulated with the composite monophonic and stereophonic audio signals as illustrated in FIG. 4*b*. The modulated signal, at a carrier frequency of 88.2 MHz, with the standard broadcast audio sidebands illustrated in FIG. 4*b*, is then filtered and amplified by the second filter/amplifier 240. This signal is combined with the SSB modulated digital signal from the first filter/amplifier 260 to form a composite signal. This composite signal includes both the standard broadcast stereophonic audio sidebands modulated on the carrier at 88.2 MHz, and the SSB modulated signal carrying the digital audio signal centered at 70 kHz above the carrier (88.27 MHz), as illustrated in FIG. 4*b*. This composite signal is then power amplified by the power amplifier 270 and supplied to the transmitting antenna 280 for transmission to FM radio receivers.

Figure 6:
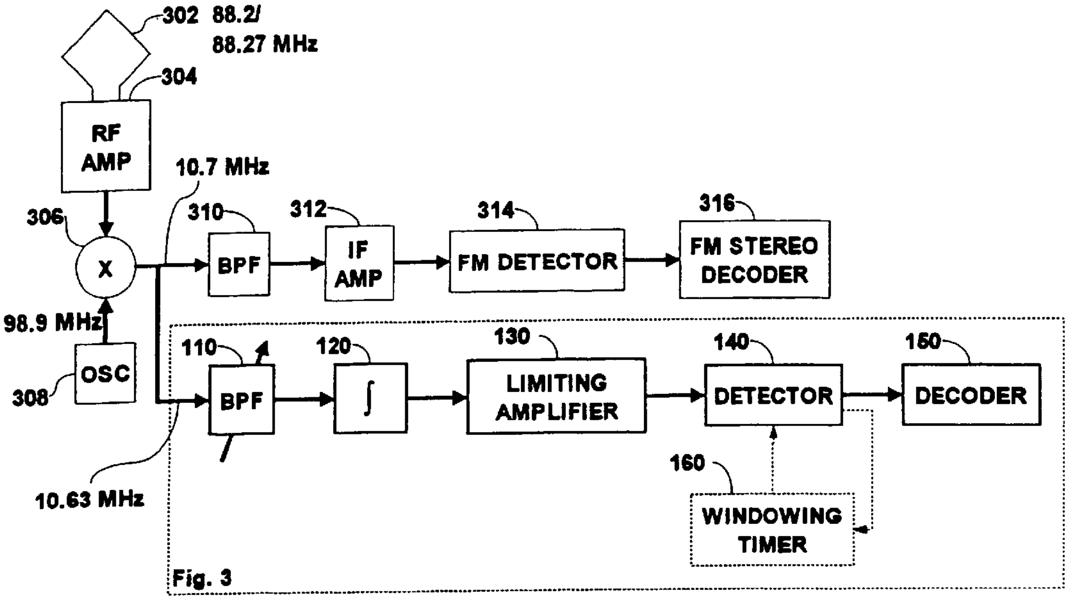
FIG. 6 is a block diagram of an FM broadcast receiver according to the present invention which can receive a signal modulated by an FM broadcast transmitter illustrated in FIG. 5.

FIG. 6 is a block diagram of an FM broadcast receiver which can receive a signal modulated by an FM broadcast transmitter illustrated in FIG. 5. In FIG. 6, those elements which are the same as those illustrated in FIG. 3 are outlined with a dashed rectangle labeled FIG. 3, are designated with the same reference numbers and are not described in detail below. In FIG. 6, a receiving antenna 302 is coupled to an RF amplifier 304. An output terminal of the RF amplifier 304 is coupled to a first input terminal of a first mixer 306. An output terminal of a first oscillator 308 is coupled to a second input terminal of the first mixer 306. An output terminal of the first mixer 306 is coupled to respective input terminals of a BPF 310 and a tunable BPF 110. An output terminal of the BPF 310 is coupled to an input terminal of an intermediate frequency (IF) amplifier 312 which may be a limiting amplifier. An output terminal of the IF amplifier 312 is coupled to an input terminal of an FM detector 314. An output terminal of the FM detector 314 is coupled to an input terminal of an FM stereo decoder 316.

In operation, the RF amplifier 304 receives and amplifies RF signals from the receiving antenna 304. The first oscillator 308 generates a signal at 98.9 MHz. The combination of the first oscillator 308 and the first mixer 306 down-converts the 88.2 MHz main carrier signal to 10.7 MHz, and the SSB digital audio signal from 88.27 MHz to 10.63 MHz. The BPF 310 passes only the FM stereo sidebands (L+R and L−R) around 10.7 MHz in a known manner. The IF amplifier 312 amplifies this signal and provides it to an FM detector 314 which generates the baseband composite stereo signal. The FM stereo decoder 316 decodes the baseband composite stereo signal to generate monophonic and/or stereophonic audio signals (not shown) representing the transmitted audio signals, all in a known manner.

In the illustrated embodiment, the tunable BPF 110 is tuned to a center frequency of 10.63 MHz, and passes only the digital audio signal around that frequency. In the illustrated embodiment, the passband of the BPF 110 runs from 10.53 MHz to 10.73 MHz. The combination of the BPF 110, integrator 120, limiting amplifier 130, detector 140, decoder 150 and windowing timer 160 operates to extract the modulated digital audio signal, and demodulate and decode that signal to reproduce the digital audio signal, in the manner described above with reference to FIG. 3. The digital audio signals from the decoder 150 are processed in an appropriate manner by further circuitry (not shown) to generate audio signals corresponding to the transmitted digital audio signal. More specifically, the signal is depacketized, and any errors introduced during transmission are detected and corrected. The corrected bit stream is then converted to a stereo audio signal, all in a known manner.

The embodiment described above provides the equivalent compression performance of a 1024 QAM system. However, in practice QAM systems are limited to around 256 QAM due to the difficulty of correcting noise and multipath intersymbol interference resulting from the tight constellation spacing. The above system has no ISI problem because of the narrow and widely spaced carrier pulses. In short, higher data rates may be transmitted in narrower bandwidth channels with none of the problems associated with other techniques, such as QAM.

Figure 7:
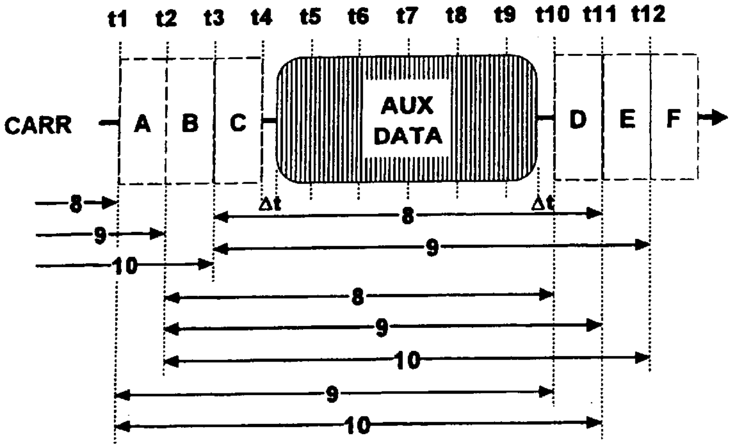
FIG. 7 is a waveform diagram useful in understanding the operation of another embodiment of a modulator which may be used in the present invention.

Referring back to FIG. 2, in the CARR signal, it may be seen that there are relatively wide gaps between carrier pulses during which no carrier signal is transmitted. These gaps may be utilized in an alternate embodiment of a system according to the present invention. FIG. 7 is a more detailed waveform diagram of the CARR signal useful in understanding the operation of a modulator in accordance with this alternate embodiment. As described above, in the encoder illustrated in FIG. 1 an encoding clock signal has a period one-ninth of the bit period of the NRZ signal. Dashed vertical lines in FIG. 7 represent encoding clock signal periods. Permitted time locations of carrier pulses are represented by dashed rectangles. A carrier pulse may occur either 8, 9 or 10 clock pulses after a preceding one. Thus, carrier pulses may occur in any one of three adjacent clock periods. Carrier pulse A is assumed to be 8 clock pulses from the previous one, carrier pulse B is assumed to be 9 clock pulses from the preceding one, and carrier pulse C is assumed to be 10 clock pulses from the preceding one.

As described above, when a carrier pulse is 8 clock pulses from the preceding one (A), this indicates a trailing edge in the NRZ signal, and can only be immediately followed by either a 9 clock pulse interval (D), representing no change in the NRZ signal, or a 10 clock pulse interval (E), representing a leading edge in the NRZ signal. Similarly when a carrier pulse is 10 clock pulses from the preceding one (C), this indicates a trailing edge in the NRZ signal, and can only be immediately followed by either an 8 clock pulse interval (E), representing a leading edge in the NRZ signal, or 9 clock pulse interval (F), representing no change in the NRZ signal. When a carrier pulse is 9 clock pulses from the preceding one (B), this indicates no change in the NRZ signal, and can be immediately followed by either an 8 clock pulse (D), representing a trailing edge in the NRZ signal, another 9 clock pulse (E), representing no change in the NRZ signal, or a 10 clock pulse (F) interval, representing a leading edge in the NRZ signal. This is all illustrated on FIG. 7. It is apparent that of the nine encoding clock periods in a NRZ bit period, one of three adjacent periods (t1–t4) can potentially have carrier pulses, while the other six (t4–t10) cannot have a carrier pulse.

During the interval when no carrier pulses may be produced in the CARR signal (from times t4 to t10), other auxiliary data may be modulated on the carrier signal. This is illustrated in FIG. 7 as a rounded rectangle (AUX DATA) with vertical hatching. A guard period of Δt after the last potential carrier pulse (C) and before the next succeeding potential carrier pulse (D) surrounding this gap is maintained to minimize potential interference between the carrier pulses (A)–(F) carrying the digital audio signal and the carrier modulation (AUX DATA) carrying the auxiliary data.

Figure 8:
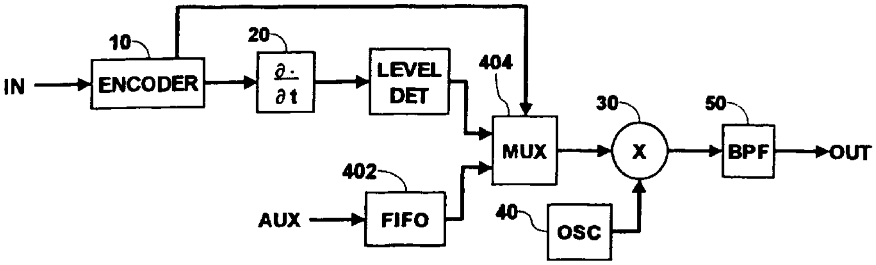
FIG. 8 is a block diagram of another embodiment of a modulator which may be used in the present invention.

FIG. 8 is a block diagram of an embodiment of the present invention which can implement the inclusion of auxiliary data in the modulated encoded data stream. In FIG. 8, those elements which are the same as those illustrated in FIG. 1 are designated by the same reference number and are not described in detail below. In FIG. 8, a source (not shown) of auxiliary data (AUX) is coupled to an input terminal of a first-in-first-out (FIFO) buffer 402. An output terminal of the FIFO buffer 402 is coupled to a first data input terminal of a multiplexer 404. An output terminal of the multiplexer 404 is coupled to an input terminal of the mixer 30. The output terminal of the level detector 25 is coupled to a second data input terminal of the multiplexer 404. A timing signal output terminal of the encoder 10 is coupled to a control input terminal of the multiplexer 404.

In the illustrated embodiment, the auxiliary data signal AUX is assumed to be in condition to directly modulate the carrier signal. One skilled in the art will understand how to encode and otherwise prepare a signal to modulate a carrier in a manner most appropriate to the characteristics of that signal. In addition, in the illustrated embodiment, the auxiliary data signal is assumed to be in digital form. This is not necessary, however. The auxiliary data signal may also be an analog signal.

In operation, the encoder 10 includes internal timing circuitry (not shown) which controls the relative timing of the pulses. This timing circuitry may be modified in a manner understood by one skilled in the art to generate a signal having a first state during the three adjacent encoding clock periods t1 to t4, when pulses may potentially occur in the CARR signal, and a second state during the remaining encoding clock periods t4 to t10. This signal may be used to control the multiplexer 404 to couple the output terminal of the differentiator 20 to the input terminal of the mixer 30 during the periods (t1 to t4) when pulses may occur and to couple the output terminal of the FIFO buffer 402 to the mixer 30 otherwise (t4 to t10). During the periods (t1 to t4) when the output terminal of the differentiator 20 is coupled to the mixer 30, the circuit of FIG. 8 is in the configuration illustrated in FIG. 1, and operates as described above in detail.

During the periods (t4+Δt to t10−Δt) when the FIFO buffer 402 is coupled to the mixer 30. (taking into account the guard bands Δt), the data from the FIFO buffer 402 modulates the carrier signal from the oscillator 40. The FIFO buffer 402 operates to receive the digital auxiliary data signal AUX at a constant bit rate, and buffer the signal during the time periods (t1–t4) when carrier pulses (A)–(C) may be produced. The FIFO buffer 402 then provides the stored auxiliary data to the mixer 30 at a higher bit rate during the time period (t4+Δt to t10−Δt) when the auxiliary data is to be transmitted. The net throughput of the bursts of auxiliary data through the CARR signal must match the constant net throughput of auxiliary data from the auxiliary data signal source (not shown). One skilled in the art will understand how to match the throughputs, and also how to provide for overruns and underruns, all in a known manner.

Figure 9:
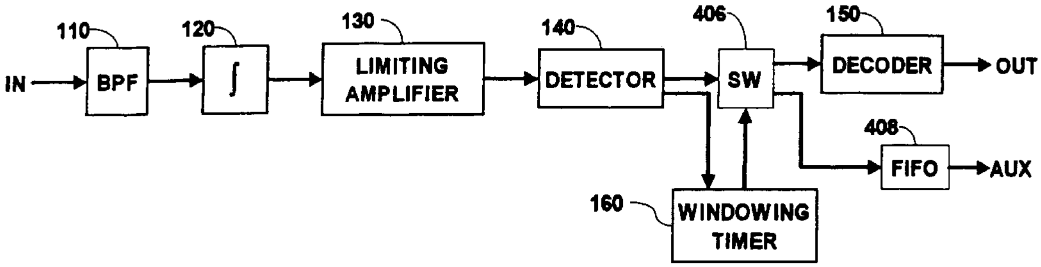
FIG. 9 is a block diagram of another embodiment of a receiver, which may be used in the present invention, which can receive the signal produced by the system illustrated in FIG. 8.

FIG. 9 is a block diagram of a receiver which can receive the signal produced by the system illustrated in FIG. 8. In FIG. 9, those elements which are the same as those illustrated in FIG. 3 are designated with the same reference number and are not described in detail below. In FIG. 9, the output terminal of the detector 140 is coupled to an input terminal of a controllable switch 406. A first output terminal of the controllable switch 406 is coupled to the input terminal of the decoder 150. A second output terminal of the controllable switch 406 is coupled to an input terminal of a FIFO 408. An output terminal of the FIFO 408 produces the auxiliary data (AUX). The output terminal of the windowing timer 160 is coupled, not to an enable input terminal of the detector 140, as in FIG. 3, but instead to a control input terminal of the controllable switch 406.

In operation, the detector 140 in FIG. 9 is always enabled. The windowing signal from the windowing timer 160 corresponds to the timing signal generated by the encoder 10 in FIG. 8. The windowing signal has a first state during the period (t1 to t4) when carrier pulses (A)–(C) could potentially occur, and a second state otherwise (t4 to t10). During the period (t1 to t4) when carrier pulses (A)–(C) could potentially occur the windowing timer 160 conditions the controllable switch 406 to couple the detector 140 to the decoder 150. This configuration is identical to that illustrated in FIG. 3, and operates as described above in detail.

During the remainder of the bit period (t4 to t10), the detector 140 is coupled to the FIFO 408. During this period, the modulated auxiliary data is demodulated and supplied to the FIFO 408. In a corresponding manner to the FIFO 402 (of FIG. 8), the FIFO 408 receives the auxiliary data bursts from the detector 140, and generates an auxiliary data output signal AUX at a constant bit rate. The auxiliary data signal represents the auxiliary data as encoded for modulating the carrier. Further processing (not shown) may be necessary do decode the received auxiliary data signal to the desired format.

What is claimed is:

1. An FM broadcast receiver, for receiving a single sideband broadcast signal including a first modulated signal representing an FM stereo signal, and a second modulated signal, having carrier pulses spaced relative to each other to represent an in-band-on-channel (IBOC) digital data signal encoded as a variable pulse width encoded signal, comprising:

a signal separator, responsive to the broadcast signal, for generating a first separated signal representing the FM stereo signal and a second separated signal representing the IBOC digital data signal;

an FM signal processor, responsive to the first separated signal, for generating a stereo audio represented by the FM stereo signal;

an IBOC signal processor, responsive to the second separated signal, for generating a digital data signal represented by IBOC digital data signal.

2. The receiver of claim 1, wherein the signal separator comprises:

a first bandpass filter for passing only the first separated signal; and a second bandpass filter for passing only the second separated signal.

3. The receiver of claim 1 further comprising a downconverter, responsive to the broadcast signal, and coupled to the signal separator.

4. The receiver of claim 1 wherein the downconverter comprises:

a local oscillator; and a mixer, coupled to the local oscillator and responsive to the broadcast signal, for converting the broadcast signal to an intermediate frequency.

5. The receiver of claim 1, further comprising an amplifier coupled between a receiving antenna and the signal separator.

6. The receiver of claim 1, wherein the FM signal processor comprises:

an FM detector responsive to the first separated signal; and an FM stereo decoder, coupled to the FM detector, for generating the stereo audio signal.

7. The receiver of claim 6, wherein the FM signal processor further comprises an amplifier coupled between the signal separator and the FM detector.

8. The receiver of claim 1, wherein the IBOC signal processor comprises:

a detector, responsive to the second separated signal, for generating a variable pulse width encoded signal in response to received carrier pulses;

a decoder for decoding the variable pulse width encoded signal to generate the digital data signal.

9. The receiver of claim 8 wherein the variable pulse width code is a variable aperture code.

10. The receiver of claim 8 wherein the carrier pulses have one of a first phase and a second phase.

11. The receiver of claim 10 wherein the first phase is substantially 180 degrees out of phase with the second phase.

12. The receiver of claim 8 further comprising, coupled between the signal separator and the detector:

an integrator; and a limiting amplifier.

13. The receiver of claim 8 further comprising:

a windowing tower, coupled to the detector; for generating a windowing signal in the temporal neighborhood when a carrier pulse is expected; and wherein:

the detector is enabled by the windowing signal.

* * * * *